United States Patent
Baek et al.

[11] Patent Number: 5,948,167
[45] Date of Patent: Sep. 7, 1999

[54] THIN FILM DEPOSITION APPARATUS

[75] Inventors: Yong Ku Baek; Young Jin Park; Jong Choul Kim, all of Kyoungki-do, Rep. of Korea

[73] Assignee: Hyundai Electronics Industries Co., Ltd., Ichon, Rep. of Korea

[21] Appl. No.: 08/718,704

[22] Filed: Sep. 27, 1996

[30] Foreign Application Priority Data

Sep. 29, 1995 [KR] Rep. of Korea ................. 95-32740

[51] Int. Cl.⁶ .............................................. C23C 16/00
[52] U.S. Cl. ............... 118/723 E; 156/345; 118/723 R; 118/504
[58] Field of Search ........................... 118/723 R, 723 E, 118/723 ER, 504; 438/731; 156/345

[56] References Cited

U.S. PATENT DOCUMENTS

| | | |
|---|---|---|
| 4,911,809 | 3/1990 | Wort et al. . |
| 5,006,192 | 4/1991 | Deguchi ................................. 156/345 |
| 5,052,339 | 10/1991 | Vakerlis et al. .......................... 118/723 |
| 5,411,591 | 5/1995 | Izu et al. . |
| 5,614,055 | 3/1997 | Fairbairn et al. ........................ 156/345 |

FOREIGN PATENT DOCUMENTS

| | | |
|---|---|---|
| 56-005974 | 1/1981 | Japan . |
| 57-102011 | 6/1982 | Japan . |
| 58-096729 | 6/1983 | Japan . |
| 63-142829 | 6/1988 | Japan . |
| 3-109329 | 11/1991 | Japan . |
| 4-107273 | 4/1992 | Japan . |
| 6-089691 | 3/1994 | Japan . |
| 6-163519 | 6/1994 | Japan . |
| 7-006961 | 1/1995 | Japan . |
| 7-076781 | 3/1995 | Japan . |
| 7-130673 | 5/1995 | Japan . |

*Primary Examiner*—Bruce Breneman
*Assistant Examiner*—Luz Alejandro
*Attorney, Agent, or Firm*—Thelen Reid & Priest L.L.P.

[57] ABSTRACT

A thin film deposition apparatus which includes a mesh type radio frequency (RF) electrode plate adapted to form plasma, a baffle guide adapted to prevent the plasma from diffusing at a low pressure, and a control unit adapted to perform control of temperature for preventing a reacting raw material from generating a degraded reaction in a gas injector, thereby enabling formation of a multi-element thin film using a multi-element reacting raw material and formation of a uniform thin film having a high density to obtain micro patterns of highly integrated semiconductor devices.

12 Claims, 1 Drawing Sheet

THIN FILM DEPOSITION APPARATUS

BACKGROUND OF THE INVENTION

1. Field of the Invention

The present invention relates to a low pressure plasma exciting single-wafer type thin film deposition apparatus used in the fabrication of semiconductors or liquid crystal displays to deposit a thin film over a water or substrate, and more particularly to a single-wafer type thin film deposition apparatus which includes a mesh type radio frequency (RF) electrode plate adapted to form plasma, a baffle guide adapted to prevent the plasma from diffusing at a low pressure, and a control unit adapted to prevent a reacted raw material from generating a degraded reaction in a gas injector.

2. Description of the Prior Art

Various thin film deposition devices are known. Conventional thin film deposition devices are mainly classified by those in which deposition of a thin film is carried out at high temperature and low pressure and those in which deposition of a thin film is carried out using excited plasma.

In the case of thin film deposition devices in which deposition of a thin film is carried cut at high temperature and low pressure, it is difficult to obtain a thin film with a desired composition, particularly, when a multi-element reacting raw material is used. This is because the reacting energy gap among the elements of the reacting raw materials increases. Furthermore, there is a considerable limitation on the process range for forming thin films.

On the other hand, in the case of thin film deposition devices using excited plasma, deposition of a thin film may be conducted on an unnecessary area when it is carried out at low pressure. This is because plasma diffuses at low pressure. Furthermore, an incomplete thin film may be formed on the area in the vicinity of the gas injector which injects the reacting raw material, thereby resulting in the formation of particles. Also, a problem is that when a thin firm is deposited over micro patterns, its coverage becomes non-uniform because of a self-bias effect of plasma.

SUMMARY OF THE INVENTION

Therefore, an object of the invention is to solve the above-mentioned problems involved in the prior art and to provide a thin film deposition apparatus which includes a meash type RF electrode plate adapted to form plasma, a baffle guide adapted to prevent the plasma from diffusing at a low pressure, and a control unit adapted to perform control of temperature for preventing a reacting raw material from generating a degraded reaction in a gas injector, thereby enabling formation of a multi-element thin film using a multi-element reacting raw material and formation of a uniform thin film having a high density on micro patterns of a highly integrated semiconductor device.

In accordance with the present invention, this object is accomplished through a thin film deposition apparatus comprising: a chamber body having an outer wall defining a reaction chamber for receiving a wafer and depositing a thin film over the wafer therein a heating block disposed in the reaction chamber and adapted to heat a wafer laid thereon a manifold disposed above the chamber body and adapted to supply reacting raw materials; a gas injector connected between the manifold and the reaction chamber and adapted to inject the reacting raw materials fed from the manifold into the reaction chamber in gas phase; a baffle guide mounted to the chamber body in the reaction chamber in such a manner that it surrounds the gas injector at its upper portion and the wafer heating block at its low portion, the baffle guide serving to prevent gas of the reacting raw materials injected from the gas injector from diffusing or being vented; and a radio frequency electrode plate disposed above the wafer in the reaction chamber and adapted to generate plasma.

By such a construction, the thin film deposition apparatus can perform deposition of a thin film using a multi-element reacting raw material in a plasma exciting manner at high temperature and low pressure, so that the thin film can have a dense structure exhibiting a good coverage for micro patterns. In this regard, the apparatus of the present invention can be applied to the fabrication of highly integrated semiconductor devices. Furthermore, it is possible to obtain a thin film having a good quality as compared to conventional cases.

BRIEF DESCRIPTION OF THE DRAWINGS

Other objects and aspect of the invention will become apparent from the following description of embodiments with reference to the accompanying drawings in which.

DETAILED DESCRIPTION OF THE PREFERRED EMBODIMENTS

Figure 1:
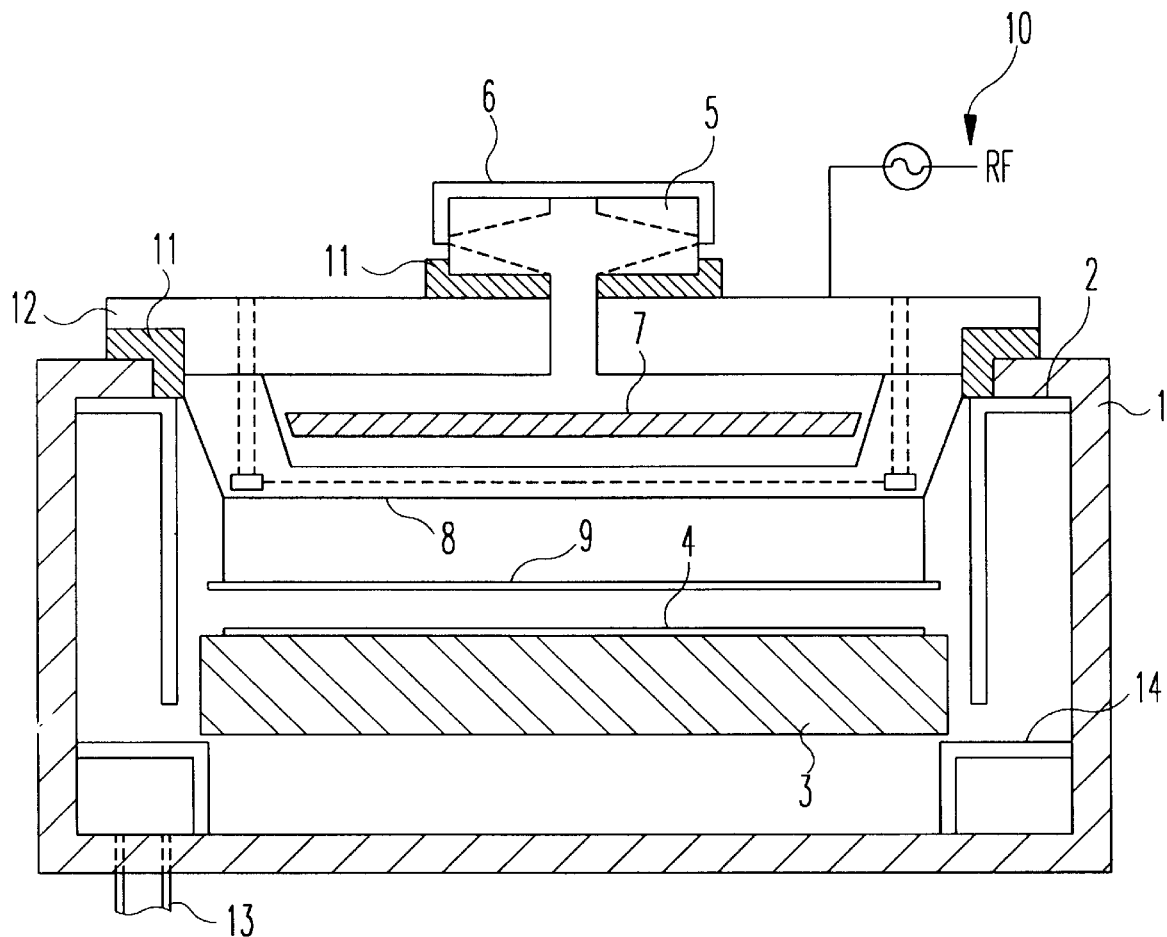
FIG. 1 is a sectional view illustrating a thin film deposition apparatus according to the present invention.

Referring to FIG. 1, a thin film deposition apparatus according to the present invention in shown.

As shown in FIG. 1, the thin film deposition apparatus includes a chamber body 1 in which a reaction chamber for conducting deposition of a thin film. In the reaction chamber, a water heating block 3 is disposed to heat a wafer 4 laid thereon. An upper chamber body 12 is also laid on the chamber body 1. At the central portion of the upper chamber body 12, a manifold 5 is mounted which supplies a mixture of reacting raw materials to the reaction chamber.

The thin film deposition apparatus also includes a gas injector connected to the manifold 5. The gas injector includes a pair of shower plates 7 and 8 serving to inject the reacting raw materials fed from the manifold 5 into the reaction chamber in gas 5 phase. The shower plates 7 and 8 of the gas injector will be described in detail hereinafter.

A cylindrical baffle guide 2 is mounted in the reacting chamber in such a manner that it surrounds the shower plates 7 and 8, the gas injector at its upper portion and the wafer 4 on the wafer heating block 3 at its low portion. The cylindrical baffle guide 2 serves to prevent the gas injected from the gas injector from diffusing or being vented through vacuum ports which will be described hereinafter.

In the reaction chamber, a mesh type RF electrode plate 9 is disposed above the wafer 4 on the wafer heating block 3 so as to form plasma.

The manifold 5, which serves to mix reacting raw materials for forming a desired thin film, is connected to pipes for respectively supplying those reacting raw materials. When the reacting raw materials, which are maintained in liquid/solid phase at normal temperature, are injected from the manifold 5 in gas phase, they may change into their original phase due to a cooling effect generated during the injection. To this end, the manifold 5 is equipped with a temperature control unit including a heating jacket 6 and a thermocouple (not shown).

The gas injector has a shower type construction so that they can uniformly inject the mixed reacting raw materials from the manifold 5 over the wafer 4. That is, the gas injector include the primary shower head plate 7 which is provided with a plurality of pores having a diameter of 0.1 to 1 mm and arranged at intervals of 5 to 10 mm. The gas injector also includes the secondary shower head plate 8 which in provided with a plurality of pores having a diameter of 1 to 2 mm and arranged at intervals of 2 to 3 mm. Heat generated from the wafer heating block 3 adapted to heat the wafer 4 is transferred to the secondary shower head plate 8 of the gas injector. Since the secondary shower head plate is heated by the transferred heat, the reacting raw material mixture may generate a deposition reaction at the heated gas injector. In order to prevent the generation of such a deposition reaction, a cooling/heating path is provided. The cooling/heating path in defined by a vacuum guide 14 disposed around the bottom portion of the reaction chamber. The cooling/heating path also serves to maintain the reaction chamber at a desired temperature.

The mesh type RF electrode plate 9 disposed beneath the secondary shower plate 8 of the gas injector has a construction capable of forming plasma over the wafer 4 irrespective of the distance between the plate 9 and secondary shower plate. That is, the RF electrode plate 9 consists of a wire mesh made of an electrically conductive material such as platinum, tungsten, SiC, or stainless steel and having a wire diameter of about 1 mm and a mesh width of 2 to 3 mm.

Since the plate 9 is adapted for application of RF (see RF source 10), it operates irrespective of the gas flow injected from the gas injector. Accordingly, the plate 9 can operate normally even when it is heated to a high temperature. In conventional constructions using an integral shower head which conducts both the application of RF and the gas injection, a non-uniform thin film may be formed, thereby resulting in the formation of particles on a wafer on which the thin film is deposited. On the contrary, in accordance with the construction of the present invention, a thin film may be deposited only on the mesh plate 9. In this case, accordingly, it is possible to deposit a dense thin film over the wafer 4.

The baffle guide 2, which surrounds the shower plates 7 and 8 of the gas injector and the heating block 3 supporting the wafer 4 in the reaction chamber of the chamber body 1, has a cylindrical construction made of an electrical insulator such as ceramic or quartz. The baffle guide 2 serves to prevent the gas injected through the gas injector from being directly vent through vacuum ports. When formation of plasma in conducted at low pressure, the baffle guide 2 also prevent& the plasma from diffusing between the RF electrode mesh plate 9 and wafer 4.

It is important that the baffle guide 2 completely surrounds the gas injector at its upper portion and the heating block 3 supporting the wafer 4 at its lower portion. The baffle guide 2 is radially spaced apart from the heating block 3 by a distance of about 3 to 5 mm.

The vacuum guide 14, which is disposed around the bottom portion of the reaction chamber, serves to uniformly apply vacuum pressure to the wafer 4 in all directions so as to generate a uniform flow of gas in the reaction chamber. The vacuum guide 14 has a plurality of uniformly spaced vacuum ports 13 having a diameter of about 5 to 10 mm.

As mentioned above, the wafer heating block 3, which is disposed in the lower portion of the reaction chamber to support the wafer 4 thereon, serves to heat the wafer 4.

Isolators 11 are interposed between the chamber body 1 and upper chamber body 12 and between the upper chamber body 11 and manifold 5, respectively, to insulate the wall of the chamber body 1 from RF.

As is apparent from the above description, the present invention provides a thin film deposition apparatus which includes a mesh type RF electrode plate disposed beneath a lower one of shower plates and adapted to form plasma. The apparatus also includes a baffle guide constructed to surround the shower plates, a water and a heating block supporting the wafer and adapted to prevent the plasma from diffusing at a low pressure. The apparatus also has a function of performing control of temperature for preventing a reacting raw material from generating a degraded reaction in a gas injector. Accordingly, the thin film deposition apparatus of the present invention can perform deposition of a thin film using a multi-element reacting raw material in a plasma exciting manner at high temperature and low pressure, so that the thin film can have a dense structure exhibiting a good coverage for micro patterns. In this regard, the apparatus of the present invention can be applied to the fabrication of highly integrated semiconductor devices. Furthermore, it is possible to obtain a thin film having a good quality as compared to conventional cases.

Although the preferred embodiment of the invention have been disclosed for illustrative purposes, those skilled in the art will appreciate that various modifications, additions and substitutions are possible, without departing from the scope and spirit of the invention as disclosed in the accompanying claims.

What is claimed is:

1. A thin film deposition apparatus comprising:
    a chamber body having an outer wall defining a reaction chamber for receiving a wafer and for depositing a thin film over the wafer;
    a heating block disposed in the reaction chamber and adapted to heat the wafer;
    a manifold disposed above the chamber body and adapted to supply reacting raw materials;
    a gas injector connected between the manifold and the reaction chamber and adapted to inject the reacting raw materials fed from the manifold into the reaction chamber in gas phase;
    a baffle guide mounted to the chamber body in the reaction chamber in such a manner that it surrounds the gas injector at its upper portion and the wafer heating block at its lower portion, the baffle guide serving to prevent gas of the reacting raw materials injected from the gas injector from diffusing or being vented, wherein the baffle guide includes a cylindrically-shaped insulator; and
    a radio frequency electrode plate disposed above the wafer in the reaction chamber and adapted to generate plasma.

2. The thin film deposition apparatus in accordance with claim 1, further comprising:
    a heating/temperature control means that includes a heating jacket and thermocouple.

3. The thin film deposition apparatus in accordance with claim 1, wherein the gas injector includes:
    a primary shower plate and
    a secondary shower plate.

4. The thin film deposition apparatus in accordance with claim 3, further comprising:
    a cooling/heating path adapted to suppress an early reaction of the reacting raw materials in gas phase due to heat from the heating block transferred to an interior of the gas injector.

5. The thin film deposition apparatus in accordance with claim 1, further comprising:

a cooling/heating path adapted to suppress an early reaction of the reacting raw materials in gas phase due to heat from the heating block transferred to an interior of the gas injector.

6. The thin film deposition apparatus in accordance with claim 1, wherein the radio frequency electrode plate includes:

a wire mesh made of an electrically conductive material and having a wire diameter of about 1 mm and a mesh width of 2 to 3 mm.

7. The thin film deposition apparatus in accordance with claim 6, wherein the electrically conductive material is selected from a group consisting of:

platinum, tungsten,

SiC, and stainless steel.

8. The thin film deposition apparatus in accordance with claim 1, wherein:

the insulator is made of ceramic or quartz.

9. The thin film deposition apparatus in accordance with claim 1, wherein:

the baffle guide is spaced at its lower portion apart from the heating block supporting the wafer by a distance of 3 to 5 mm.

10. The thin film deposition apparatus in accordance with claim 1, further comprising:

a vacuum guide disposed around a bottom portion of the reaction chamber and adapted to uniformly apply vacuum pressure to the wafer in all directions.

11. The thin film deposition apparatus in accordance with claim 10, wherein:

the vacuum guide has a plurality of uniformly spaced vacuum ports having a diameter of about 5 to 10 mm.

12. The thin film deposition apparatus in accordance with claim 10, further comprising:

isolators interposed between the chamber body and the manifold to insulate the chamber body from a portion of the manifold to which radio frequency is transmitted.

* * * * *